(12) United States Patent
Kupershmidt

(10) Patent No.: US 8,885,678 B1
(45) Date of Patent: Nov. 11, 2014

(54) ULTRA-LOW FREQUENCY NOISE EXTERNAL CAVITY SEMICONDUCTOR LASER WITH INTEGRATED WAVEGUIDE GRATING AND MODULATION SECTION ELECTRONICALLY STABILIZED BY DUAL FREQUENCY FEEDBACK CONTROL CIRCUITRY

(71) Applicant: Redfern Integrated Optics, Inc., Santa Clara, CA (US)

(72) Inventor: Vladimir Kupershmidt, San Francisco, CA (US)

(73) Assignee: Redfern Integrated Optics, Inc., Santa Clara, CA (US)

( * ) Notice: Subject to any disclaimer, the term of this patent is extended or adjusted under 35 U.S.C. 154(b) by 0 days.

(21) Appl. No.: 13/902,651

(22) Filed: May 24, 2013

Related U.S. Application Data

(60) Provisional application No. 61/651,409, filed on May 24, 2012.

(51) Int. Cl.
*H01S 3/10* (2006.01)
*H01S 5/068* (2006.01)

(52) U.S. Cl.
CPC ................................. *H01S 5/06817* (2013.01)
USPC ............ 372/28; 372/21; 372/26; 372/29.015; 372/32; 372/38.01; 372/38.07; 372/38.08; 372/38.02; 372/29.011; 372/29.016; 372/29.023; 372/29.02

(58) Field of Classification Search
CPC ... H01S 5/0683; H01S 5/0264; H01S 5/0265; H01S 3/005; H01S 3/1305; H01S 3/0085; H01S 3/109; H01S 3/1312; H01S 3/1062; H01S 5/0085; H01S 3/08027; H01S 5/0078; H01S 3/10; H01S 3/13; H01S 5/00; H01S 5/06817

USPC ........ 372/21, 28, 26, 29.015, 32, 38.1, 38.01, 372/38.07, 38.08, 20, 29.011, 29.016, 372/29.023, 38.02, 29.02
See application file for complete search history.

(56) References Cited

U.S. PATENT DOCUMENTS

| | | | |
|---|---|---|---|
| 6,331,991 B1 * | 12/2001 | Mahgerefteh | 372/33 |
| 2003/0076866 A1 * | 4/2003 | Baillargeon et al. | 372/99 |
| 2005/0041704 A1 * | 2/2005 | Fukuda et al. | 372/32 |
| 2006/0159135 A1 | 7/2006 | Cliché et al. | |
| 2010/0054288 A1 | 3/2010 | He | |
| 2010/0303121 A1 | 12/2010 | Alalusi et al. | |
| 2012/0183004 A1 | 7/2012 | Kupershmidt | |
| 2014/0036940 A1 * | 2/2014 | Tanaka et al. | 372/20 |

OTHER PUBLICATIONS

U.S. Appl. No. 61/540,466, filed Sep. 28, 2011, Kuperschmidt.
G.A. Cranch, "Frequency Noise Reduction in Erbium-Doped Fiber Distributed-Feedback Lasers by Electronic Feedback", Optics Letters, vol. 27, No. 13, Jul. 1, 2002.

* cited by examiner

Primary Examiner — Colleen A Matthews
Assistant Examiner — Delma R Forde
(74) Attorney, Agent, or Firm — David H. Jaffer; Pillsbury Winthrop Shaw Pittman LLP

(57) ABSTRACT

Embodiments of the present invention use an external cavity laser source with dual input terminals, such as bias current for a gain section, and a voltage signal for a modulator section. An aspect of the present invention provides an ultra-low frequency noise external cavity frequency modulated (FM) semiconductor laser source frequency stabilized by a dual electronic feedback circuitry applied to semiconductor gain section and a modulation section. A further aspect of the present invention provides an optical frequency discriminator based on homodyne phase demodulation using an unbalanced Michelson interferometer with fiber optics delay and a symmetrical 3×3 optical coupler.

9 Claims, 2 Drawing Sheets

ULTRA-LOW FREQUENCY NOISE EXTERNAL CAVITY SEMICONDUCTOR LASER WITH INTEGRATED WAVEGUIDE GRATING AND MODULATION SECTION ELECTRONICALLY STABILIZED BY DUAL FREQUENCY FEEDBACK CONTROL CIRCUITRY

CROSS REFERENCE TO RELATED APPLICATION

This application claims priority from U.S. Provisional Application Ser. No. 61/651,409, filed May 24, 2012, the contents of which are incorporated herein by reference.

FIELD OF THE INVENTION

The present invention relates generally to stable operation of external cavity lasers (ECL), and particularly to dual frequency feedback control circuitry for semiconductor lasers with external cavity.

BACKGROUND

It is known that in the most demanding applications for fiber optic interferometric sensors, such as geophones, hydrophones and distributed Coherent Rayleigh (CR) effect based sensors require ultra-low frequency noise laser sources. Ultra-low frequency noise laser sources are also required in other applications, such as, precision navigation and atomic clocks. Industrial applications such as continuous wave (CW) coherent Doppler LIDAR and remote Laser Doppler Vibrometry (LDV) require ultra-low excess noise contribution, i.e. very narrow Lorentzian linewidth laser sources with linewidth below 1 kHz. The most widely used approach for frequency noise reduction is to utilize electronic feedback frequency control, which is primarily used with distributed feedback (DFB), DFB-fiber and semiconductor external cavity lasers.

There are a few major requirements to achieve significant frequency noise reduction using electronic feedback control based on the optical frequency discriminators.

First, free running lasers must have low frequency noise to begin with, i.e. thre lasers must be qualified as a "sensing" laser or "narrow-linewidth" laser. Examples of such lasers are a fiber lasers for sensing applications such as developed by Koheras Inc, Orbits Lightwave Inc, NP Photonics, Inc and PLANEX type semiconductor external cavity lasers developed in Redfern Integrated Optics, Inc. of Santa Clara, Calif.

Secondly, optical discriminators that convert laser frequency noise $\delta v$ to voltage, noise $\delta V$, must have large sensitivity ($\delta V/\delta v$) for such conversion. Examples of such optical discriminators are Fabry-Perot (FP), Mach-Zehnder (MZ), and Michelson interferometers or any other type of reference stabilized cavity. Choice of discriminator depends on the ability of linear conversion of frequency noise to the voltage noise (known as "quadrature conditions"). Requirements include continuous operation of frequency stabilized laser without reset, packaging stability and dimensions, ease of fabrication and the inherent sensitivity to environmentally induced frequency drift.

Another important consideration is how a bandwidth (BW) of frequency feedback loop is limited by the laser properties i.e. how an electronic error signal is applied to a laser source. Low frequency noise semiconductor laser sources, such as DFB-fiber laser with piezoelectric PZT tuning section, DFB lasers, ECLs with semiconductor gain elements, etc. have such inputs applied as a bias current. Various references, such as, US Patent publication 2010/0054288, US Patent Publication 2006/0159135 etc. described such frequency stabilized laser sources with different choice of optical discriminators, and different architecture of electronic feedback control. Regardless of all differences in the laser sources and feedback architecture, there is one common way of applying error frequency signal in all the references: error frequency signal is applied to the bias current input of semiconductor gain element.

The inventor of the present application has recognized that such approach represents fundamental limitations on frequency noise reduction as described below.

When a current error signal is applied at particular frequency to the laser current bias, there is an associated phase change. However, when phase change is below so called phase reversal (i.e. when the phase changes by 180 degrees), sign of the feedback remain unchanged, i.e. feedback remains negative. In DFB sources such phase reversal frequency is between 300 kHz and few MHz. In the external cavity lasers such phase reversal frequency is usually below 100 kHz. Particularly for PLANEX type lasers, such frequency is below few hundred kHz. Operating bandwidth (BW) of a system is often dictated by the phase reversal. Bandwidth of the feedback control circuitry plays the most important role in frequency noise reduction. The residual phase-noise variance in close loop feedback operation is inversely proportional feedback bandwidth, $\sigma_\phi^2 \sim \Delta v/BW$.

Accordingly, what is needed is an implementation of a feedback control circuitry that ensures stable operation of an external cavity semiconductor laser for applications that demand low frequency-noise.

SUMMARY OF THE INVENTION

Embodiments of the present invention use an external cavity laser source with dual input terminals, such as bias current for a gain section, and a voltage signal for a modulator section.

An aspect of the present invention provides an ultra-low frequency noise external cavity frequency modulated (FM) semiconductor laser source frequency stabilized by a dual electronic feedback circuitry applied to semiconductor gain section and a modulation section.

A further aspect of the present invention provides an optical frequency discriminator based on homodyne phase demodulation using an unbalanced Michelson interferometer with fiber optics delay and a symmetrical 3×3 optical coupler.

The invention itself, together with further aspects, objects and advantages, can be better understood by persons skilled in the art in view of the following detailed description and the drawings.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
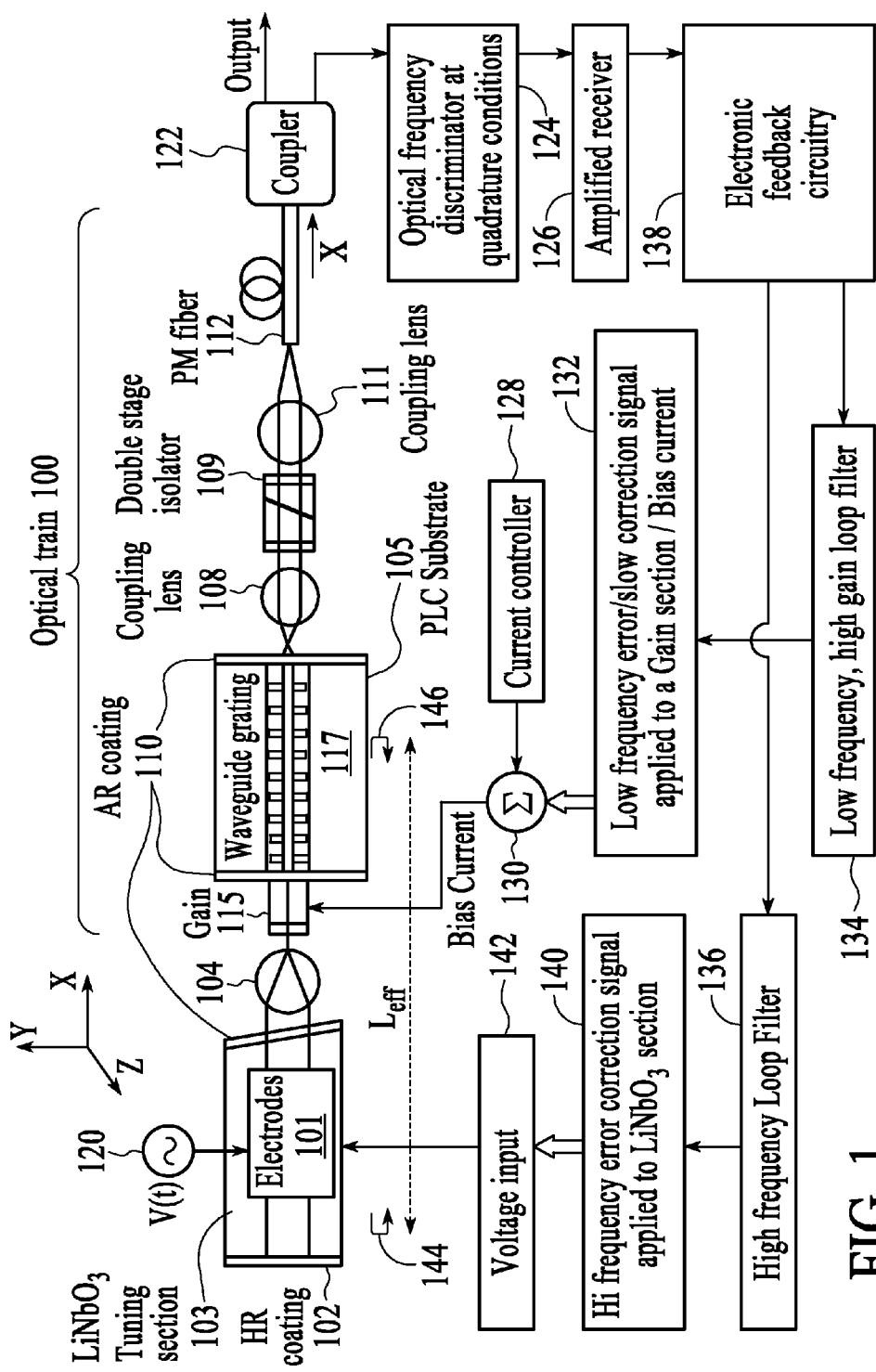
FIG. 1 is a schematic diagram showing various components of a system according to an embodiment of the present invention, where an ultra-low frequency-noise external cavity frequency-modulated laser source is frequency-stabilized by a dual electronic feedback circuitry that uses an optical frequency discriminator a quadrature conditions.
Figure 2:
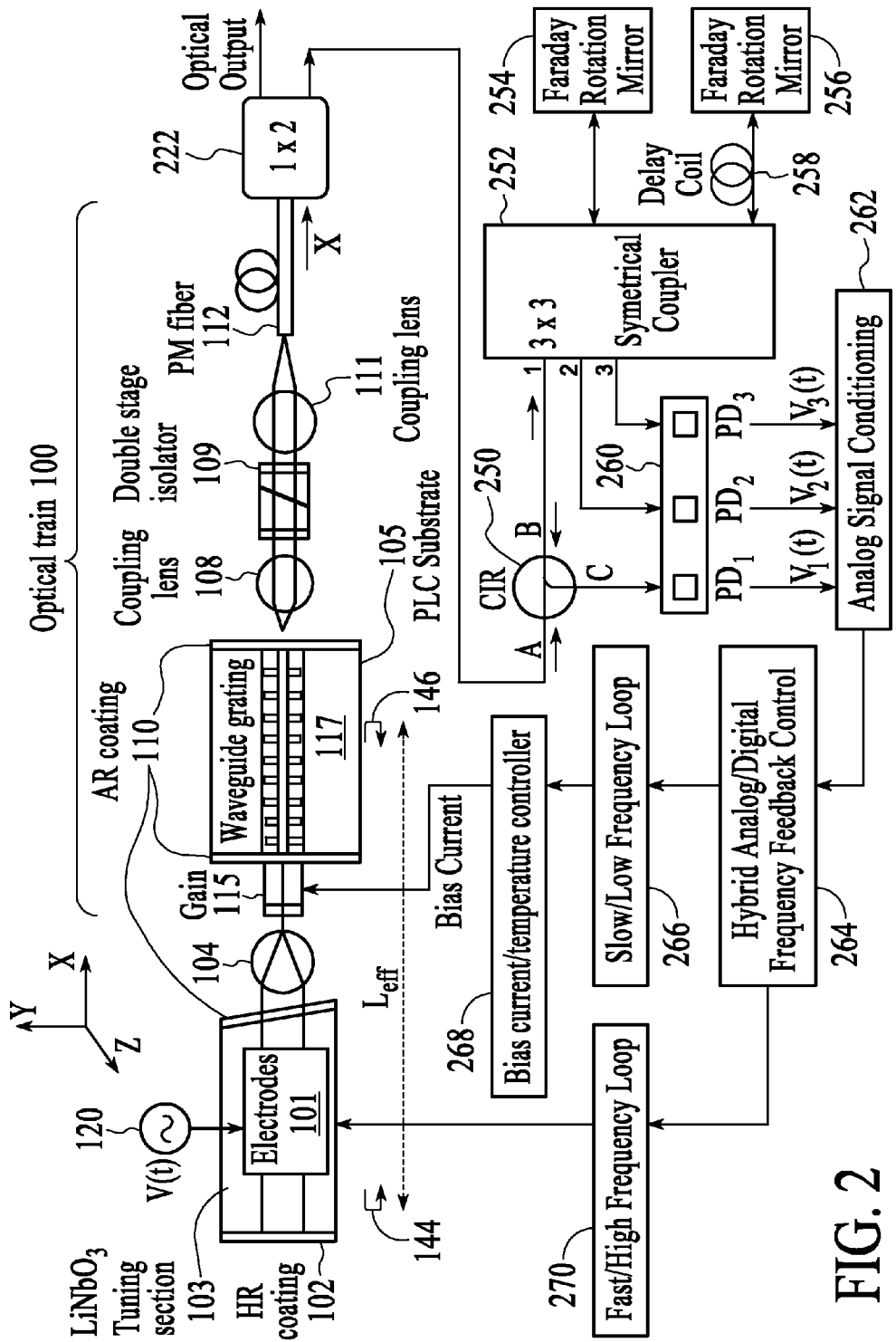
FIG. 2 is a schematic diagram showing an optical frequency discriminator based on homodyne phase demodulation, according to an embodiment of the present invention.

The functional blocks shown in FIGS. 1 and 2 are shown for illustrative purposes only. More blocks may be added, some blocks may be deleted, some blocks may be combined/functionally separated, depending on the end goal and application.

DETAILED DESCRIPTION OF EXAMPLE EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

The present invention uses planar Bragg gratings (PBG) on planar lightwave circuit (PLC) platform. PLC can also be referred to as planar waveguide circuit (PWC). PLC platform may be implemented on a standard silica-on-silicon material system, or other material systems. This cavity structure of an ECL implemented on PLC offers a significant reduction in vibration sensitivity over other ECL designs. Furthermore, PBG offers the advantage of high single polarization selectivity by appropriate design.

A non-limiting example of an ECL is external cavity semiconductor laser that can be frequency-stabilized by embodiments of the present invention is a PLANEX-type laser with integrated grating waveguide and lithium niobate (LiNbO$_3$) modulation section, as described in U.S. Provisional Patent Application 61/540,466, filed on 28 Sep. 2011, titled, "Semiconductor External Cavity Laser with Integrated Planar Silica-on-Si Waveguide Grating and Wide Bandwidth Frequency Modulation," by Kupershmidt et al. Such an FM laser source, i.e. an FM PLANEX laser has dual inputs which allow to change frequency response (frequency tuning) by changing a bias current of a gain element or by applying a tuning voltage signal to the LiNbO$_3$ integrated section (with a high BW up to 100 MHz). Availability of such FM sources enables a different feedback architecture with dual (high and low frequency) inputs and allows achieving ultra-low frequency noise both in low frequency spectrum (sensing application) and high frequency spectrum (ultra-narrow linewidth below tens of Hz).

FIG. 1 shows a first embodiment of the present invention. This embodiment provides an external cavity arrangement having frequency modulation with uniform frequency response and wide bandwidth (up to 100 MHz), and at the same time, maintains desirable properties, such as narrow linewidth and low frequency noise.

To meet such requirements, this embodiment uses a hybrid architecture of the external cavity where a high reflectivity back facet is formed by a LiNbO$_3$ bulk crystal in double pass configuration, and an antireflection (AR)-coated semiconductor gain element coupled to the back facet through a micro lens (ball or aspheric types).

The front end of the external cavity, similar to what is described in US2010/0303121 by Alalusi et al., is formed by a gain element butt-coupled to the dispersive Bragg grating formed in polarization maintaining PLC waveguide. Such front end of the external cavity maintains all essential elements of PLANEX-type design which combines integration of the semiconductor gain chip with Silica-on-Si Planar PLC with asymmetric, high reflectivity waveguide grating. The contents of US2010/0303121 is incorporated herein by reference.

Frequency modulation of the hybrid external cavity is achieved by the application of the AC-voltage signal to the electrodes of LiNbO3 element such that it generates an electrical field parallel (transverse configuration) to the direction of TE-mode circulating in the external cavity. The invention uses as an advantage a known fact that semiconductor gain element acts as a polarizer which partially transmits (e.g., at 100:1 ratio) only TE-mode aligned to the direction of applied electrical field in the LiNbO3 element. Such induced electrical filed changes a refractive index in the LiNbO$_3$ element and correspondingly optical path of circulating TE-mode which results in a frequency modulation in the external cavity. Modulation of LiNbO3 chip allows to overcome thermal limitations associated with bias current modulation approach and to achieve a wide and uniform phase modulation bandwidth.

In the above embodiment, the waveguide is located between the electrodes and utilizes the orientation of propagating TE-polarization mode (which is parallel to electrical field in the waveguide) as an advantage. Waveguides may be directly bonded to the back facet of high performance AR-coated Fabry-Perot (FP) chip with taper type waveguide having mode expansion to match LiNbO$_3$ and FP chip propagation modes. Front end of such cavity use optical train 100 based on Silica-on-Si PLC with asymmetric, high reflectivity waveguide grating, such as what is commercially available from Redfern Integrated Optics (RIO) Inc. of Santa Clara, Calif.

Such optical arrangement design results in optimum coupling efficiency and maximum possible integration of the active elements of the external cavity and produces very narrow linewidth. Hybrid integration with waveguide FM mirror, among other things, allows to utilize low $V_\pi$ parameter of waveguide optical modulator and as a result, achieves high amplitude of frequency modulation and minimizes alignment requirements for packaging of such cavity.

Referring back to FIG. 1, external cavity in the system is formed by the TE-mode circulating between back facet with high reflectivity (HR) 102 coated LiNbO$_3$ tuning phase section 103 and front end of the PLC chip 117 having integrated waveguide with asymmetric high reflectivity grating, while the active gain in such cavity is provided by the gain chip 115.

The gain chip 115 may comprise semiconductor InP-based multi quantum well (MQW) Fabry-Perot (FP) chip with front and back facets coated with high performance AR coating 110 (Reflectivity, R<$510^{-4}$). The PLC chip 117 is based on a Silica-on-Si substrate 105.

The laser beam is coupled via an AR-coated coupling micro-lens 104 such as ball or aspheric type lens. An example dimension range of the diameter of the lens may be of 0.3-0.7 mm. The lens 104 collimates the laser beam and then enters $LiNbO_3$ crystal 103 which has a front surface with AR-coating and is tilted by 5-7 degree. Note that the AR-coating 110 is applied at both ends of the chip 117 and at the tilted end of the chip 103.

Laser beam with TE-polarization mode parallel to the Z-axis (optical) of a crystal enters the $LiNbO_3$ tuning section 103, propagates along the crystal, and is reflected back from the HR coated mirror end 102 (double pass propagation). During transit, the laser beam experiences a change in propagation delay in the cavity $\sim 2Lr_{33}V(t)$, where L is length of the crystal along the propagation direction, $r_{33}$ is the electro-optical coefficient of the $LiNbO_3$ crystal, $r_{33}$=31 pm/V at $\lambda$=1.55 μm and V(t) is an applied modulation voltage applied from a voltage source 120 to the electrodes 101 of $LiNbO_3$ crystal 103. In FIG. 1, $L_{eff}$ is the effective length of the cavity that the beam traverses (144 denoting the reflected beam from HR coated facet of the $LiNbO_3$ crystal 103, and 146 denoting the reflected beam from the waveguide grating in the PLC chip 117.

The present invention uses as an advantage a known fact that semiconductor gain element acts as a polarizer which transmits (~100:1 ratio) only TE-mode aligned to the direction of applied electrical field in the $LiNbO_3$ element. Such induced electrical field changes a refractive index in the $LiNbO_3$ element and correspondingly optical path of circulating TE-mode which results in a frequency modulation in the external cavity. Modulation of LiNbO3 chip allows to overcome thermal limitations associated with bias current modulation approach and achieves a wide and uniform phase modulation bandwidth.

As shown in both FIGS. 1 and 2, the external cavity laser source has dual input terminals: one input is a bias current applied to a gain chip 115, and the other input is a voltage applied from the voltage source 120 to the $LiNbO_3$ section 103 that frequency-modulates the laser. Also, both FIGS. 1 and 2 show other components of the optical train 100, including the PLC chip 117, a coupling lens 108, a double stage isolator 109, a second coupling lens 111, and a polarization-maintaining (PM) fiber 112. Persons skilled in the art will recognize that not all of the optical elements 108, 109, and 111 are essential for the implementation of the dual frequency feedback circuitry of the present invention. The PM fiber 112 transmits the beam to a coupler (element 122 in FIG. 1) or a splitter (element 222 in FIG. 2) that splits the beam into two parts: one is an output part, and the other is to be launched into an optical frequency discriminator component.

In the embodiment shown in FIG. 1, the optical frequency discriminator module 124 maintains quadrature conditions. After conversion of frequency noise to the voltage signal with the help of quadrature biased frequency discriminator 124, voltage signal is conditioned and amplified at the receiver 126, which is coupled to (or integrated with) the electronic feedback circuitry 138. The resulting signal from the electronic feedback circuitry 138 is split in two parts, one part directed to a low frequency loop filter 134, and the other part directed to a high frequency loop filter 136. Low frequency loop filter 134 has a BW below 5-10 kHz and provides high gain frequency noise suppression (using an integrator circuitry 130), while high frequency loop filter 136 operates in the frequency region up to few tens of MHz with flat phase noise response. Such loop filter provides error correction between 10 kHz to few tens of MHz. As a result electronically stabilized FM laser source has ultra-low frequency noise performance in the frequency region up to 100 kHz, which makes it suitable for demanding application, such as sensing (e.g., seismic and structural monitoring), navigation and Coherent LIDAR applications etc.

The low frequency error or slow correction signal 132 from filter 134 is integrated with the signal from current controller 128 to output a bias current that is applied to the gain chip 115. On the other hand, the high-frequency error correction signal 140 in converted into a voltage input 142, which is applied to the LiNbO3 chip 103 to ultimately control the FM modulation of the laser.

As mentioned above, one of the objects of the present invention is to provide a semiconductor laser that operates with a frequency feedback control loop for frequency-noise reduction. Semiconductor lasers with frequency feedback control may utilize a homodyne optical phase demodulation approach, as shown in the embodiment in FIG. 2. Such an approach does not require maintaining a quadrature condition, as required in the frequency discriminator configuration in FIG. 1. Phase demodulation can be implemented with help of an unbalanced Michelson interferometer with fiber optics delay and symmetrical 'n×n' optical coupler, where 'n' is an integer. For example, FIG. 2 shows a 3×3 symmetrical optical coupler 252 and a delay coil 258.

Homodyne phase demodulation does not require maintaining a quadrature condition and is not affected by the laser wavelength drift. As a result, it is possible to decouple the signal of interest (proportional to the laser frequency-noise) from the signal drift without the concern of maintaining the quadrature conditions. This enables a continuous reset-free operation of the semiconductor laser.

An object of the invention is to utilize unique properties of a free-running semiconductor external cavity laser that has very-low frequency-noise to begin with. The frequency stabilization circuitry has the ability to provide electronic feedback to the bias current. Such combination is unique and is necessary to achieve frequency-noise reduction to ultra-low levels.

Another object of the invention is to provide Michelson Interferometer (MI) optical phase demodulator with integrated photodiode (PD) array operating in typical conditions required for intended applications.

FIG. 2 shows details of the operation of ultra-low noise semiconductor laser with hybrid analog/digital frequency feedback control using Michelson interferometer with fiber optic delay, symmetrical 3×3 coupler, and integrated PD array, which function as homodyne phase demodulator.

Referring back to FIG. 2, a system is illustrated for frequency noise reduction using the frequency feedback control. The system incorporates the principles of the present invention. A polarization-maintaining (PM) fiber 112 couples to a 1×2 splitter 222. The splitting ratio may be in the range of 5/95-10/90, i.e., a small portion (5-10%) of the laser's optical power is coupled via an optical circulator 250 (with input ports A and B, and output post C) into an unbalanced Michelson interferometer (MI), and the rest goes to another optical output path. The Michelson interferometer has at its input (port 1) a symmetrical 3×3 coupler 252 and two optical branches terminating at corresponding Faraday Rotation Mirrors (FRM) 254 and 256. One of the branches has an optical delay coil 258. Laser light launching into MI is split and propagates down the optical paths of the two optical branches. The FRMs 254 and 256 help to prevent interferometric polarization fading.

The light launched into the optical branches experience a double propagating path upon the reflection from FRMs 254 and 256, and propagates back via the output port C of optical circulator 102 and output ports 2 and 3 of the symmetrical 3×3 coupler 252. Each output via output ports C, 2, and 3 represents interferometric beating of two optical fields.

Using the optical circulator 250 in combination with the 3×3 coupler 252 allows minimization of optical losses in one output and equalizes optical power distribution between the coupler's outputs 2 and 3. The three outputs C, 2, 3 provide phase information that is necessary for operation of the frequency feedback control loop. Each of the optical outputs is coupled into photodiode (PD) array 260, which may have high gain trans-impedance amplifiers (TIAs—not shown specifically in the figure), which results in three analog voltage outputs $V_1(t)$, $V_2(t)$, $V_3(t)$.

In FIG. 2, the module 262 conditions the analog signal and sends it to the hybrid analog/digital frequency feedback control module 264, which splits the signal into two parts: one part directed to slow/low frequency loop filter 266, the other part directed to a fast/high frequency loop filter 270.

The signal from the low frequency loop filter 266 goes to bias current/temperature controller module 268, which determines the bias current to be applied to gain chip 115. The signal from high frequency loop filter 270 is converted into a voltage signal that is applied to the LiNbO3 chip 103.

A suitable calibration method may be implemented based on the unique properties of a planar semiconductor external cavity lasers. For example, an ECL source used in the embodiments of the present invention has a very low dc-chirp ($\delta v/\delta I$) in response to the change in the bias current 'I', which can be leveraged in the calibration algorithm. Such a calibration approach results in the complete calibration of the assembled and packaged optical phase demodulator and takes into account all of the manufacturing-related differences and variations associated with different gains of the PD array, coupling and splicing losses, and phase offsets between different branches of the symmetrical 3×3 optical coupler.

Persons skilled in the art will appreciate that the present invention describes frequency stabilization circuitry that can be configured to operate with various types of lasers. Types of lasers may include Distributed Feedback (DFB) lasers and external cavity lasers (ECL). To that effect, contents of the co-pending co-owned application Ser. No. 13/325,001, are incorporated by reference in its entirety. Also incorporated herein by reference in its entirety is co-pending co-owned application Ser. No. 13/631,656, which describes components of the optical train shown in FIGS. 1 and 2.

The descriptions above are intended to be illustrative, not limiting. Thus, it will be apparent to one skilled in the art that modifications may be made to the invention as described without departing from the scope of the claims set out below.

What is claimed is:

1. A system for reducing a frequency-noise of an external cavity semiconductor laser, wherein the external cavity includes a frequency modulator section and a gain section, the system comprising:
    an optical frequency discriminator circuit that receives a portion of output light from the external cavity semiconductor laser;
    an electronic frequency feedback control circuit that receives an output of the optical frequency discriminator circuit, and outputs a low frequency electronic signal and a high frequency electronic signal;
    a current control circuit that outputs a bias current to be applied to the gain section of the external cavity semiconductor laser, the bias current being calculated based on the low frequency electronic signal; and
    a voltage control circuit that outputs a voltage signal to be applied to the frequency modulator section of the external cavity semiconductor laser, the voltage signal being calculated based on the high frequency electronic signal,
    wherein the bias current and the voltage signal collectively reduce the frequency-noise of the external cavity semiconductor laser.

2. The system of claim 1, wherein the optical frequency discriminator circuit comprises:
    a fiber-optic unbalanced interferometric circuit coupled to the semiconductor laser via an optical circulator; and
    a photodiode (PD) array for generating homodyne optical phase demodulated voltage signals from back-propagating optical output signals received from the fiber-optic unbalanced interferometric circuit.

3. The system of claim 2, wherein the fiber-optic unbalanced interferometric circuit comprises:
    a 3×3 symmetrical coupler;
    a first optical path with a first length, terminating at a first Faraday Rotation Mirror (FRM); and
    a second optical path with a second length different from the first length to introduce a predetermined amount of delay, the second optical path terminating at a second FRM.

4. The system of claim 3, wherein the predetermined amount of delay is introduced by a fiber-optic delay coil.

5. The system of claim 4, wherein one back-propagating optical output signal coming out of the 3×3 symmetrical coupler is routed to the PD array via the circulator, and two back-propagating optical output signals are routed directly to the PD array, each of the three back-propagating optical output signals representing interferometric beating of two optical fields from the first optical path and the second optical path.

6. The system of claim 5, wherein the PD array outputs three analog voltage signals containing homodyne optical phase demodulation information.

7. The system of claim 6, wherein the electronic frequency feedback control circuit comprises a hybrid analog and digital frequency feedback control circuit, wherein three analog voltage signals outputted by the PD array are amplified and split into an analog component and a digital component by a radio frequency (RF) splitter, wherein an analog signal conditioning unit receives the analog component of the voltage signals, and a digital signal processor receives the digital component of the voltage signals, both the analog signal conditioning unit and the digital signal processor being included in the hybrid analog and digital frequency feedback control circuit.

8. The system of claim 7, wherein the low frequency electronic signal is passed through a low frequency high gain loop filter to generate a low frequency error correction signal that is used to calculate the bias current.

9. The system of claim 7, wherein the high frequency electronic signal is passed through a high frequency loop filter to generate a high frequency error correction signal that is used to calculate the voltage signal.

* * * * *